United States Patent
Fernandez et al.

(10) Patent No.: US 12,169,210 B2
(45) Date of Patent: Dec. 17, 2024

(54) PROBE TIP WITH RIGID FRAME AND FLEXIBLE TIP PORTION

(71) Applicant: Keysight Technologies, Inc., Santa Rosa, CA (US)

(72) Inventors: Nicholas Fernandez, Colorado Springs, CO (US); Ashley Yang, Colorado Springs, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 123 days.

(21) Appl. No.: 18/109,299

(22) Filed: Feb. 14, 2023

(65) Prior Publication Data

US 2024/0272199 A1 Aug. 15, 2024

(51) Int. Cl.
*G01R 1/067* (2006.01)
*G01R 31/28* (2006.01)

(52) U.S. Cl.
CPC ..... *G01R 1/06788* (2013.01); *G01R 1/06738* (2013.01); *G01R 1/06772* (2013.01); *G01R 31/2889* (2013.01)

(58) Field of Classification Search
CPC ............ G01R 1/06788; G01R 1/06738; G01R 1/06772; G01R 31/2889
See application file for complete search history.

(56) References Cited

U.S. PATENT DOCUMENTS

| | | | |
|---|---|---|---|
| 6,956,362 B1 * | 10/2005 | Campbell | G01R 1/06788 324/754.02 |
| 6,967,473 B1 | 11/2005 | Reed et al. | |
| 7,056,134 B2 | 6/2006 | Martin et al. | |
| 9,404,940 B1 * | 8/2016 | Campbell | G01R 1/06788 |
| 2005/0162147 A1 * | 7/2005 | Cannon | H01R 13/625 324/72.5 |
| 2016/0178665 A1 | 6/2016 | McGrath, Jr. et al. | |

OTHER PUBLICATIONS

"N5439A InfiniiMax III ZIF Probe Head," Keysight Technologies, 2000-2024, https://www.keysight.com/us/en/product/N5439A/infiniimax-iii-zif-probe-head.html, 3 pgs.
"N5440A InfiniiMax III 28 GHz Ceramic ZIF Tips," Keysight Technologies, 2000-2024, https://www.keysight.com/us/en/product/N5440A/28ghz-zif-tips.html, 2 pgs.
"N2838A InfiniiMax III PC Board ZIF Tips, 25 GHZ," Keysight Technologies, 2000-2024, https://www.keysight.com/us/en/product/N2838A/infiniimax-iii-pc-board-zif-tips-25-ghz-.html, 3 pgs.
"MX0100A InfiniiMax II Micro Probe Head Kit," Keysight Technologies, 2000-2024, https://www.keysight.com/us/en/product/MX0100A/inifiniimax-ii-micro-probe-head-kit.html, 3 pgs.
"1168/9B InfiniiMax II Probes," Keysight Technologies, May 2018, 2 pgs.

* cited by examiner

*Primary Examiner* — G. M. A Hyder

(57) ABSTRACT

A probe tip for connecting a test instrument to a device under test (DUT) includes a rigid frame configured to attach to a stable base; a connector assembly attached to or integrated with the rigid frame; and a flexible tip portion removably connected at a proximal end to the connector assembly. The flexible tip portion includes multiple DUT contacts at a distal end and multiple electrical leads respectively connected to the multiple DUT contacts.

20 Claims, 9 Drawing Sheets

PROBE TIP WITH RIGID FRAME AND FLEXIBLE TIP PORTION

BACKGROUND

Modern test and measurement (T&M) instruments, such as digital oscilloscopes, interface with probes for receiving radio frequency (RF) signals from devices under test (DUTs). Generally, a probe includes a probe tip with a connector at a distal end configured to electrically connect to the DUT, an interface at a proximal end for interfacing with the T&M instrument, and a cable running the length of the probe for conducting the RF signals between the DUT and the T&M instrument. To conduct differential RF signals, for example, the cable may include a coaxial cable for conducting the differential RF signals between the probe tip and the T&M instrument.

The probe tips may be flexible, such as flex printed circuit assembly (PCA) probe tips. The flexible probe tips may be soldered to target DUTs, in which case they must have sufficient length and flexibility to connect the DUT and the probe without damaging the solder joints. However, accommodating higher measurement bandwidths requires use of shorter flexible probe tips in order to manage signal loss. As the probe tips become shorter and thus less flexible, it becomes increasingly difficult to attach the probe tips to the DUTs and keep them attached without damaging the solder joints.

In addition, replaceable or disposable flexible probe tips normally include RF connectors that are permanently affixed to the PCA, for example. The probe tip is then soldered directly to the DUT. Such soldering is difficult by nature, and often leads to damage and disposal of the entire probe tip. This may be an expensive process due to the cost of the RF connectors.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
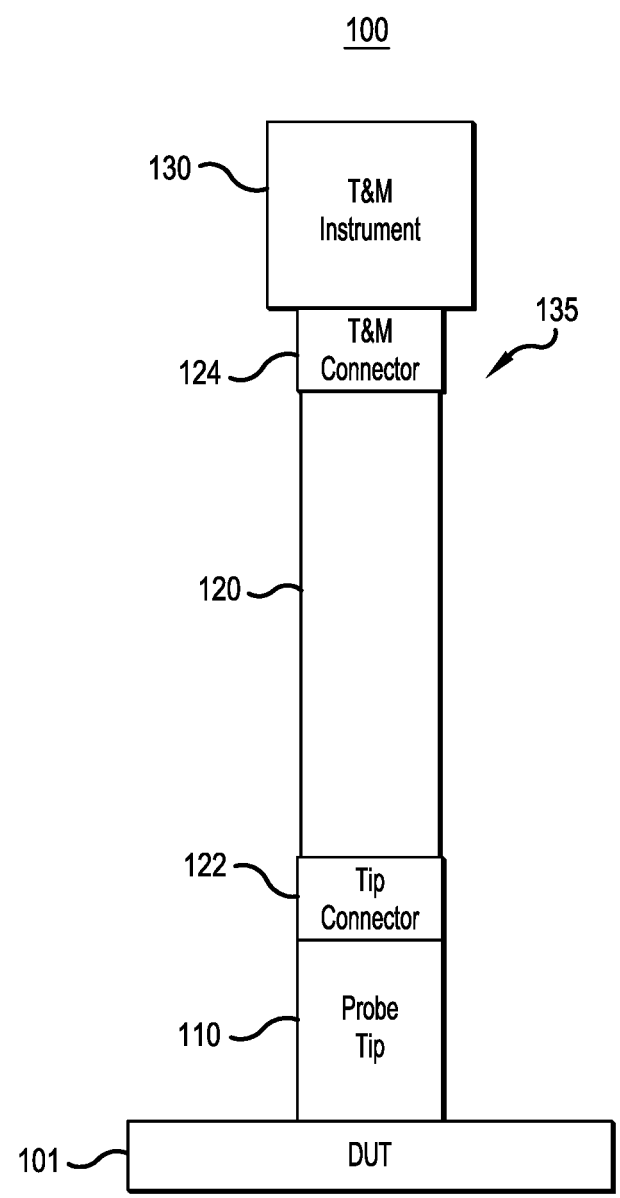
FIG. 1 is a simplified block diagram illustrating a system for performing testing and measurement of a device under test (DUT), including a probe with a flexible probe tip, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90 degrees with respect to the view in the drawings, an element described "above" or "below" another element would now be "adjacent" to the other element; where "adjacent" means either abutting the other element, or having one or more layers, materials, structures, etc., between the elements.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Various embodiments provide a probe having a probe tip that incorporates a short, flexible tip portion (e.g., flex circuit) and a rigid frame. The rigid frame is configured to be affixed to a target (e.g., a DUT or a support structure holding a DUT during testing and measurement) in order to provide a structural interface with the probe that prevents damage to the solder joints connecting the flexible tip portion to the DUT. Once the rigid frame is affixed to the target, it may be used as a fixture that to help with soldering the flexible tip portion to the target. Also, various embodiments enable inexpensive flexible tip portions to be easily detachable from expensive RF connectors in the probe tip. These effectively disposable flexible tip portions provides cost advantage over solutions involving more permanently attached tip portions. In addition, the short length of the flexible tip portions (e.g., 8 cm or less) enables transmission of greater signal bandwidths (e.g., up to 65 GHz), thus providing a performance advantage over conventional solutions with longer tip portions.

According to a representative embodiment, a probe tip is provided for connecting a test instrument to a DUT. The probe tip includes a rigid frame configured to attach to a stable base; a connector assembly attached to or integrated with the rigid frame; and a flexible tip portion removably connected at a proximal end to the connector assembly. The flexible tip portion includes multiple DUT contacts at a distal end and multiple electrical traces respectively connected to the multiple DUT contacts.

According to a representative embodiment, a probe tip is provided for connecting a test instrument to a DUT. The probe tip includes a rigid cradle including multiple mounting supports configured to attach to the DUT; an amplifier socket attached to or integrated with the rigid cradle, where the amplifier socket is configured to receive a probe amplifier connected to the test instrument via a probe cable; a connector assembly attached to or integrated with the rigid cradle, where the connector assembly includes multiple RF connectors aligned with multiple RF connectors of the probe amplifier positioned in the amplifier socket; and a flexible tip portion removably connected at a proximal end to the connector assembly, where the flexible tip portion includes multiple DUT contacts at a distal end for connecting to the DUT, multiple probe contacts at a proximal end for connecting to the multiple RF connectors in the connector assembly, and multiple signal traces respectively connecting the multiple DUT contacts and multiple probe contacts.

According to a representative embodiment, a probe tip for connecting a test instrument to a DUT, the probe tip including a rigid frame including a tab insertable into a slot or a clamp attached to the DUT or to a support structure configured to hold the DUT; an amplifier socket attached to or integrated with the rigid frame, where the amplifier socket is configured to receive a probe amplifier connected to the test instrument via a probe cable; a connector assembly attached to or integrated with the rigid cradle, where the connector assembly includes multiple RF connectors aligned with multiple RF connectors of the probe amplifier positioned in the amplifier socket; and a flexible tip portion removably connected at a proximal end to the connector assembly, where the flexible tip portion includes multiple DUT contacts at a distal end for connecting to the DUT, multiple probe contacts at a proximal end for connecting to the multiple RF connectors in the connector assembly, and multiple signal traces respectively connecting the multiple DUT contacts and the multiple probe contacts.

FIG. 1 is a simplified block diagram illustrating a system 100 for performing testing and measurement of a DUT, including a flexible probe, according to a representative embodiment.

Referring to FIG. 1, system 100 includes a T&M instrument 130 and a probe 135 configured to connect the T&M instrument 130 to the DUT 101. The T&M instrument 130 may be any type of instrument that uses a probe for testing and measurement operations, such as an oscilloscope, a vector network analyzer (VNA) or a spectrum analyzer, for example. The T&M instrument 130 may include analog front-ends including signal conditioning circuitry, such as amplifiers and/or filters, for receiving and conditioning measurement signals from the DUT 101, analog to digital converters (ADCs) for digitizing the measurement signals, a processing unit for performing signal processing and analysis of the digitized measurement data output from the ADCs, as would be apparent to one skilled in the art.

The probe 135 includes a probe tip 110, a cable assembly 120, a connector assembly 122 connecting the cable assembly 120 to the probe tip 110 at a distal end of the cable assembly 120, and a T&M connector 124 connecting the cable assembly 120 to the T&M instrument 130 at a proximal end of the cable assembly 120. The cable assembly 120 may include a coaxial cable or a pair of coaxial cables, for example, for communicating differential signals received from the DUT 101 to the T&M instrument 130. The cable assembly 120 may also include a probe amplifier (not shown) for amplifying RF signals received from the DUT 101 via the probe tip 110.

The connector assembly 122 may include a pair of RF connectors, such as sub-miniature push-on micro (SMPM) connectors, for example, located at a proximal end of the probe tip 110, as discussed below. The T&M connector 124 may be implemented using any RF connector capable of coupling with the T&M instrument 130, such as a sub-miniature push-on (SMP) connector, a sub-miniature version A (SMA) connector, or a micro-miniature coaxial (MMCX) connector, a bayonet Neill-Concelman (BNC) connector, or a threaded Neill-Concelman (TNC) connector, for example.

Figure 2:
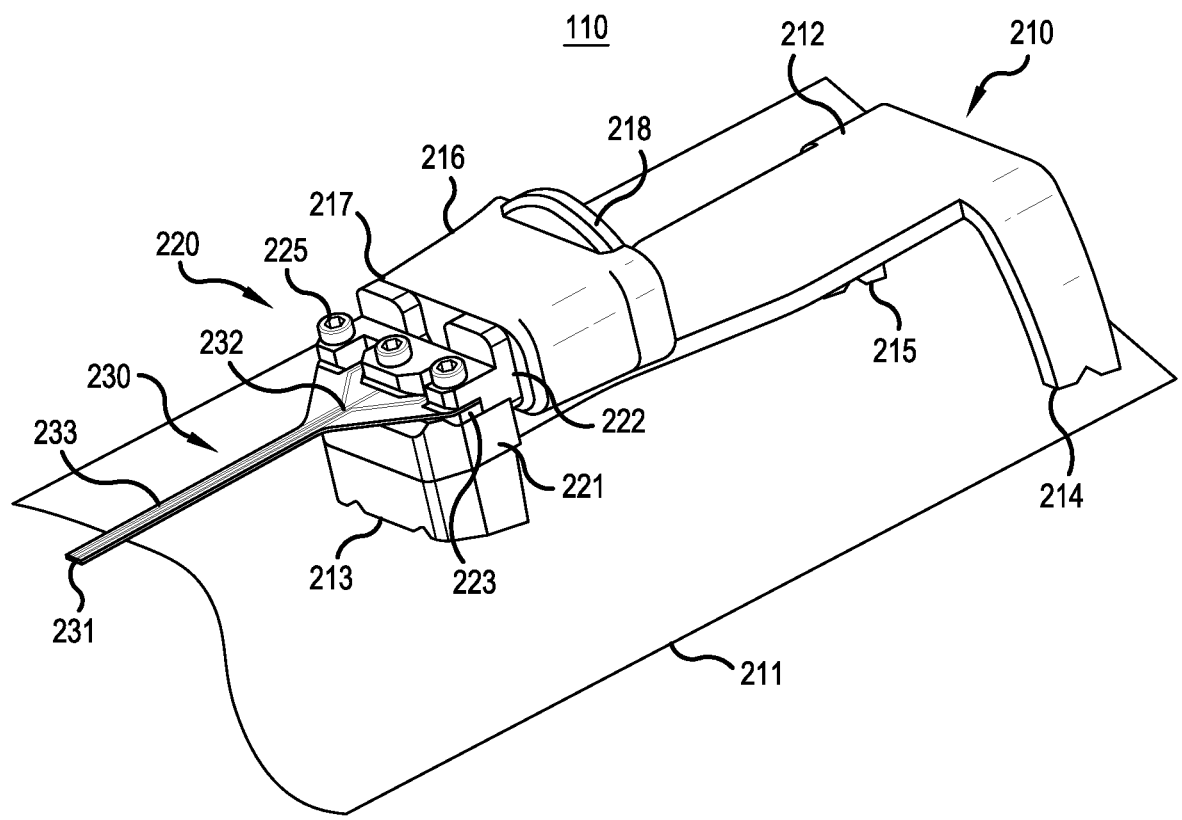
FIG. 2 is a perspective view of a probe tip of a probe for connecting a T&M instrument to a DUT, according to a representative embodiment.

FIG. 2 is a perspective view of a probe tip of a probe for connecting a T&M instrument to a DUT, according to a representative embodiment.

Referring to FIG. 2, probe tip 110 includes a rigid frame 210, a connector assembly 220 attached to or integrated with the rigid frame 210, and a flexible tip portion 230 removably attached to the connector assembly 220. The rigid frame 210 is configured to attach to a stable base 211 for stability during testing and measurement operations. The stable base 211 may be a surface of the DUT 101, which may be a printed circuit assembly (PCA) or a printed circuit board (PCB), for example. However, the stable base 211 may be a support structure (not shown) configured to hold the DUT 101 during the testing and measurement operations. In this case, the rigid frame 210 may include a tab insertable into a clamp attached to the support structure, as discussed below with reference to FIG. 7.

In the depicted embodiment, the rigid frame 210 includes a rigid cradle 212 configured to attach to the surface of the stable base 211 at multiple mounting supports, indicated by first mounting support 213, second mounting support 214 and third mounting support 215. The rigid cradle 212 may be attached using an adhesive, such as hot glue or adhesive putty, for example, at each of the first, second and third mounting supports 213, 214 and 215. Alternatively, the rigid cradle 212 may be mechanically attached using a physical connector, such as screws, clips, or pins, or may be soldered directly to the stable base 211, for example.

The rigid frame 210 also includes an amplifier socket 216 attached to or integrated with a top portion of the rigid cradle 212 (opposite the first, second and third mounting supports 213, 214 and 215). In the depicted embodiment, the amplifier socket 216 includes a distally located connector end 217 next to the connector assembly 220, and an opening 218 at a proximal end configured to receive a probe amplifier (not shown) of the cable assembly 120. The connector assembly 220 is aligned with the amplifier socket 216, and may or may not be attached to the connector end 217, discussed further with reference to FIG. 3, below.

The flexible tip portion 230 may be a flex circuit, such as a flexible PCA or a hybrid PCA wire combination, for example, although any type of compatible flexible circuitry may be incorporated without departing from the scope of the present teachings. In an embodiment, the flexible tip portion 230 may include multiple folds to enhance flexibility. Because the probe tip 110 is secured in place relative to the DUT 101 by the rigid frame 210, the flexible tip portion 230 does not need to provide sufficient length to accommodate movement of the probe 135. In other words, the flexible tip portion 230 may have a short length as compared to flexible tip portions of conventional probes since movement of the probe 135 will be constrained by attachment of the rigid frame 210 to the stable base 211. In various embodiments, the flexible tip portion 230 may be less than about 6 cm in length, for example.

The flexible tip portion 230 includes multiple DUT contacts 231 at the distal end, and multiple traces 232 respectively connected to the DUT contacts 231 and extending the length of the flexible tip portion 230 in a flexible substrate 233 for connecting with the connector assembly 220 at the proximal end. The DUT contacts 231 are removably connected (e.g., soldered) to the DUT 101 for establishing electrical connection(s). The proximal end of the flexible tip portion 230 is removably connected to the connector assembly 220, so that it is replaceable. The flexible tip portion 230 is discussed further with reference to FIGS. 5A and 5B, below.

The connector assembly 220 is configured to removably connect the proximal end of the flexible tip portion 230 to the rigid frame 210, and to the establish electrical connections between the traces 232 of the flexible tip portion 230 and RF connectors in the amplifier socket 216 of the rigid frame 210, as discussed below. In the depicted embodiment, the connector assembly 220 includes a base portion 221, a floating portion 222 arranged on the base portion 221, and a clamp portion 223 arranged on the floating portion 222. The flexible tip portion 230 is mechanically clamped between the clamp portion 223 and the floating portion 222. The connector assembly 220 further includes multiple fasteners 225 configured to apply clamping pressure between the clamp portion 223 and the floating portion 222 to mechanically couple the flexible tip portion 230 between the clamp portion 223 and the floating portion 222. The connector assembly 220 is discussed further with reference to FIGS. 5A and 5B, below.

Figure 3:
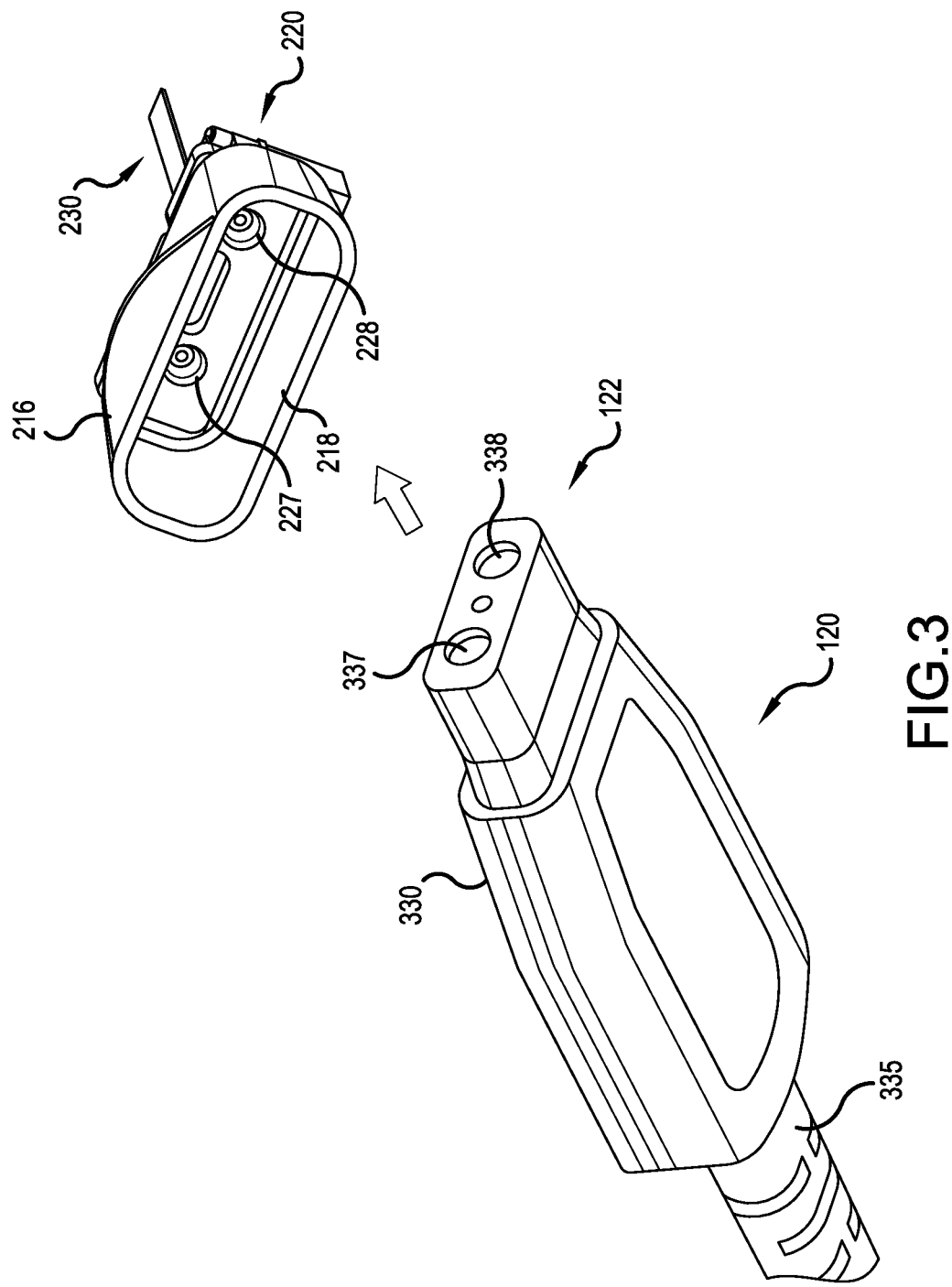
FIG. 3 is a perspective view of an amplifier socket of a probe tip for connecting a probe amplifier of a probe cable assembly, according to a representative embodiment.

FIG. 3 is a perspective view of a socket of the probe tip in FIG. 2 for connecting a probe amplifier of a probe cable assembly, according to a representative embodiment.

Referring to FIG. 3, the amplifier socket 216 of the rigid frame 210 is depicted from the proximal end, looking through the opening 218. A probe amplifier 330 attached to coaxial cable 335 of the cable assembly 120 is insertable in the opening 218 of the amplifier socket 216. The back or proximal side of the connector assembly 220 is shown through the opening 218, such that RF connectors 227 and 228 integrated with the connector assembly 220 are exposed. The RF connectors 227 and 228 are configured to mate with corresponding RF connectors 337 and 338 of the cable assembly 120, where the RF connectors 337 and 338 form the connector assembly 122 for connecting the cable assembly 120 to the probe tip 110, discussed above. The RF connectors 337 and 338 (as well as corresponding RF connectors 227 and 228) may be SMPM connectors, for example, although any type of releasable RF connectors may be incorporated without departing from the scope of the present teachings. The RF connectors 227 and 228 may be 65 GHz connectors, for example, although other high bandwidth RF connectors may be incorporated without departing from the scope of the present teachings.

In the depicted configuration, the RF connectors 227 and 228 mate with the corresponding RF connectors 337 and 338 to establish an electrical connection between the probe tip 110 and the cable assembly 120 when the probe amplifier 330 is fully inserted within the opening 218 of the amplifier socket 216. An outer perimeter of the probe amplifier 330 may substantially match (i.e., slightly smaller) an inner perimeter of the opening 218 such that the cable assembly 120 is held in place by friction. Alternatively, or in addition, the probe amplifier 330 and/or the amplifier socket 216 may include fasteners (not shown) configured to secure the cable assembly 120 within the amplifier socket 216 in order to maintain the electrical connection.

Figure 4A:
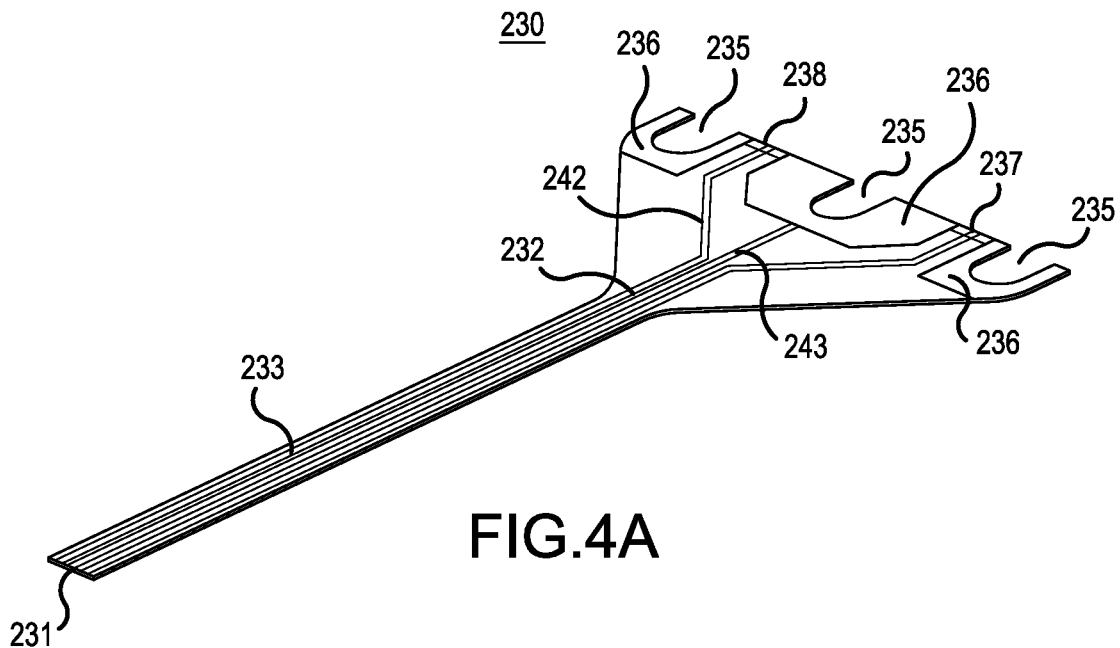
FIG. 4A is a top perspective view of a flexible tip portion of a probe tip of a probe for connecting to a DUT, according to a representative embodiment.
Figure 4B:
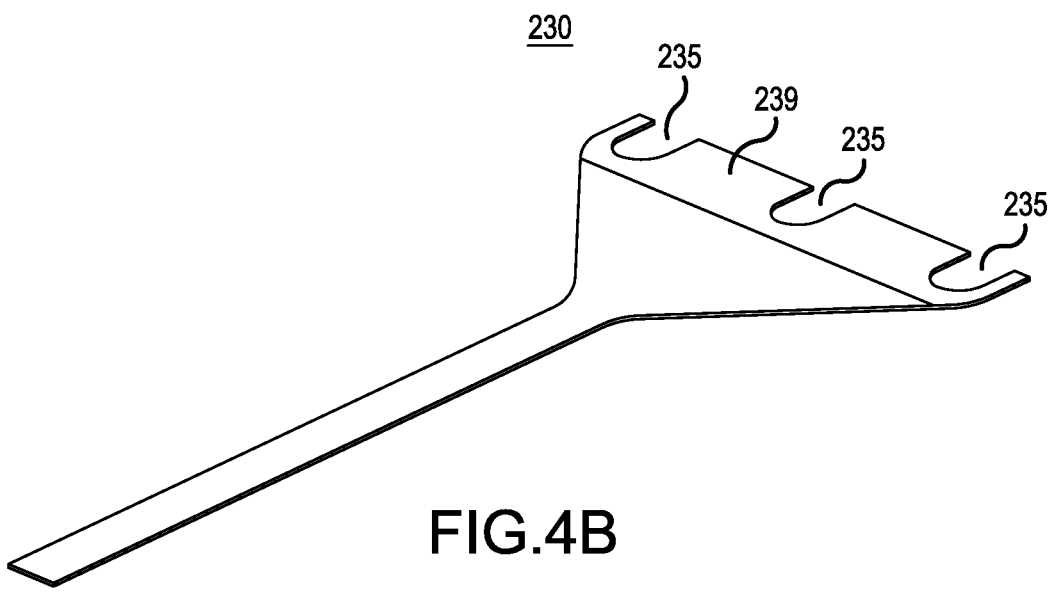
FIG. 4B is a bottom perspective view of the flexible tip portion of the probe tip of the probe for connecting to the DUT, according to a representative embodiment.
Figure 4C:
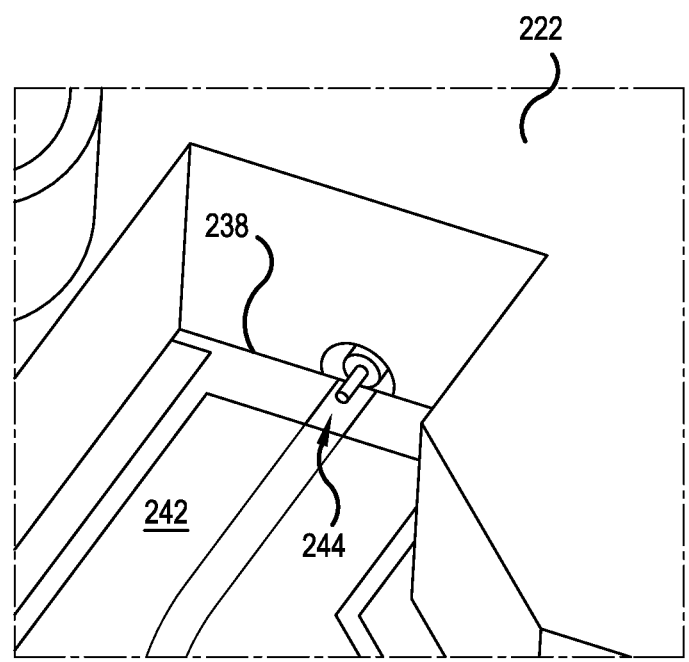
FIG. 4C is a top perspective view of the flexible tip portion inserted in an RF connection of a connector assembly of the probe tip for establishing an electrical connection with a cable assembly of the probe, according to a representative embodiment.

FIG. 4A is a top perspective view of a flexible tip portion of the probe tip in FIG. 2 for connecting to a DUT, and FIG. 4B is a bottom perspective view of the flexible tip portion of the probe tip in FIG. 2 for connecting to the DUT, according to a representative embodiment. FIG. 4C is a top perspective view of the flexible tip portion inserted in an RF connection of the connector assembly for establishing an electrical connection with the cable assembly, according to a representative embodiment.

Referring to FIGS. 4A and 4B, the flexible tip portion 230 includes the DUT contacts 231, the traces 232 and the flexible substrate 233, discussed above. The traces 232 include signal traces 242 and at least one ground trace 243. The DUT contacts 231 are located at the distal end of the flexible tip portion 230 and are temporarily connected (e.g., soldered) to circuit access points in the DUT 101 for purposes of testing and measurement. The traces 232 run from the DUT contacts 231 through the flexible substrate 233 to the proximal end of the flexible tip portion 230, where the signal traces 242 have probe contacts 237 and 238 and the at least one ground trace 243 terminates at exposed ground pads 236, which are connected to one another by exposed ground pad 239 on the opposite side of the flexible tip portion 230. The probe contacts 237 and 238 may be exposed ends of the signal traces 242, for example.

The flexible tip portion 230 also includes fastener slots 235 which correspond to the positions of the fasteners 225 and holes of the connector assembly 220 when the flexible tip portion 230 is clamped in place by the connector assembly 220. The exposed ground pads 236 are formed around the fastener slots 235, and are therefore aligned with the fasteners 225 when the flexible tip portion 230 is clamped in place by the connector assembly 220, assuring a robust electrical connection to ground via the exposed ground pads 236 and 239. Since the fastener slots 235 are open at the proximal end of the flexible tip portion 230, the flexible tip portion 230 may be inserted into and removed from a space formed between the clamp portion 223 and the floating portion 222 of the connector assembly 220 by simply loosening the fasteners 225. This prevents having to remove the fasteners 225 entirely and partially disassemble the connector assembly 220 in order to remove the flexible tip portion 230.

Referring to FIG. 4C, a portion of the flexible tip portion 230 is shown inserted in the connector assembly 220. In particular, the signal trace 242 is shown clamped in the connector assembly 220. A center pin 244 extends from the connector assembly 220 for establishing an electrical connection with the probe contact 238 of the signal trace 242. The center pin 244 is arranged so that it provides a narrow gap into which the flexible tip portion 230 slides, such that the center pin 244 contacts the probe contact 238 of the signal trace 242. On the opposite side, the center pin 244 extends through the connector assembly 220 to attach with the RF connector 228 inside the amplifier socket 216, discussed above. Again, because the flexible tip portion 230 is able to slide below the center pin 244 to make electrical contact between the probe contact 238 and the center pin 244, the flexible tip portion 230 may be inserted into and removed from the space formed between the clamp portion 223 and the floating portion 222 of the connector assembly 220 by simply loosening the fasteners 225.

Figure 5A:
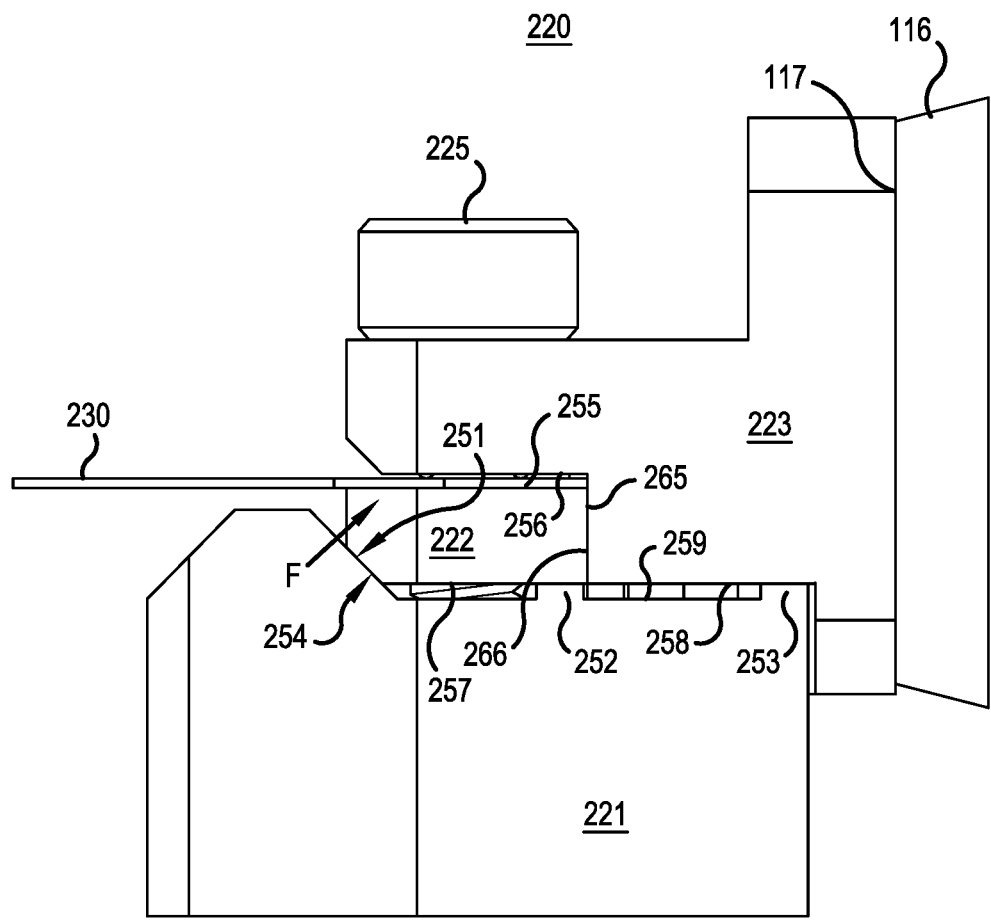
FIG. 5A is a side plan view of a connector assembly of a probe tip for connecting a flexible tip portion to a cable assembly of a probe, according to a representative embodiment.
Figure 5B:
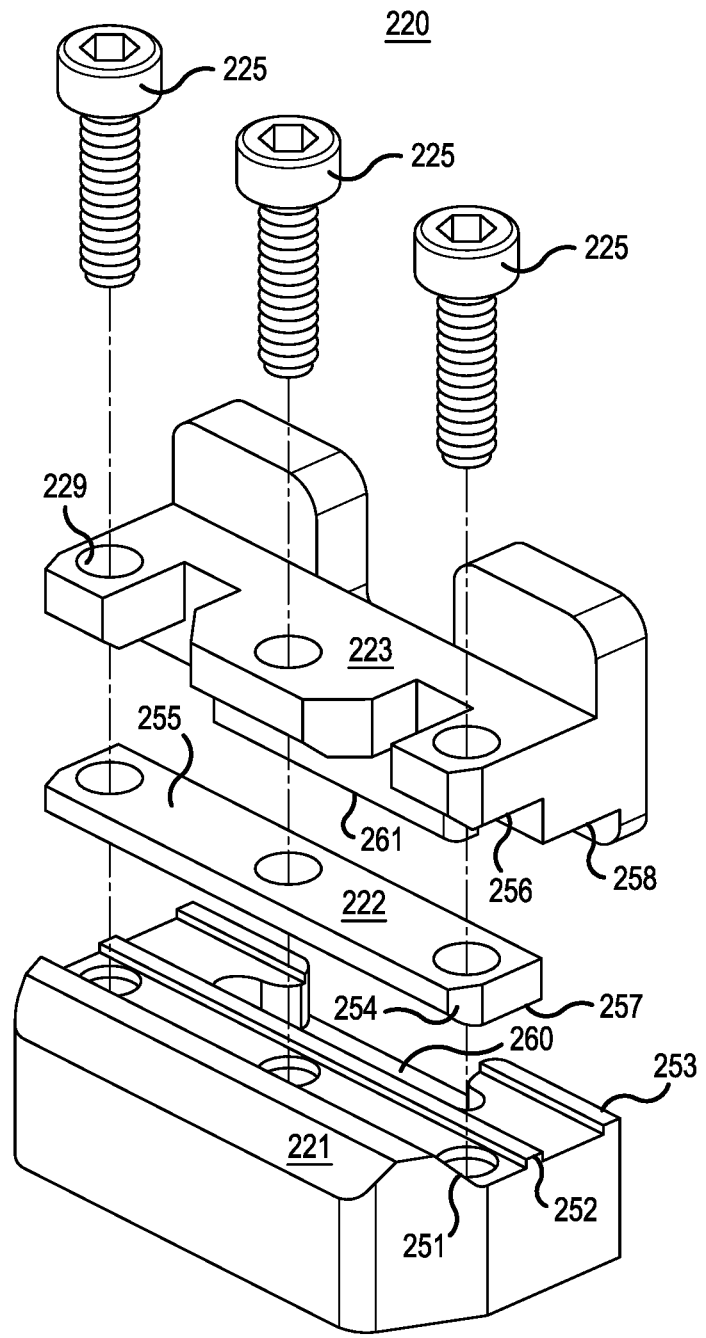
FIG. 5B is an exploded perspective view of the connector assembly of the probe tip for connecting the flexible tip portion to the cable assembly of the probe, according to a representative embodiment.

FIG. 5A is a side plan view of a connector assembly of the probe tip in FIG. 2 for connecting the flexible tip portion to the cable assembly of the probe, and FIG. 5B is an exploded perspective view of the connector assembly of the probe tip in FIG. 2 for connecting the flexible tip portion to the cable assembly of the probe, according to a representative embodiment.

Referring to FIGS. 5A and 5B, the connector assembly 220 includes the base portion 221, the floating portion 222 arranged on the base portion 221, and the clamp portion 223 arranged on the floating portion 222, as discussed above.

The base portion 221 is integrated with or attached to the rigid frame 210. For example, the base portion 221 may be attached to the rigid frame 210 at the bottom surface of the base portion 221 using mechanical fasteners, such as screws or clips, for example, although any other attachment means may be incorporated without departing from the scope of the present teachings. The clamp portion 223 abuts the connector end 217 of the amplifier socket 216, and is positioned such that the RF connectors 227 and 228 are aligned with the amplifier socket 216 and thus exposed to the RF connectors 337 and 338 of the cable assembly 120 through the opening 218, as discussed above. The clamp portion 223 may be attached to the amplifier socket 216, e.g., by the same means discussed above with reference to the base portion 221, or may simply be aligned with the amplifier socket 216, without being attached, whenever the base portion 221 is attached to the rigid frame 210.

The floating portion 222 is positioned between the base portion 221 and the clamp portion 223. The floating portion 222 is not connected to either the base portion 221 or the clamp portion 223, and therefore is configured to float as the fasteners 225 are being tightened and loosened. That is, the floating portion 222 changes its position relative to the base portion 221 and the clamp portion 223 in response to pressure applied by the fasteners 225 being increased (tightened) or decreased (loosened). The fasteners 225 pass through holes 229 aligned in the base portion 221, the floating portion 222 and the clamp portion 223. When tightened, the fasteners 225 cause clamping pressure to be applied on the flexible tip portion 230 by a top surface 255 of the floating portion 222 and a bottom surface 256 of the clamp portion 223 to hold the flexible tip portion 230 in place. The fasteners 225 may be threaded screws or bolts, for example, although any type of fastener able to apply clamping pressure sufficient to mechanically hold the flexible tip portion 230 in place at the rigid frame 210 may be incorporated without departing from the scope of the present teachings.

In the depicted embodiment, the base portion 221 and the floating portion 222 are shaped such that they enhance the clamping pressure on the flexible tip portion 230 as the fasteners 225 are tightened. In particular, the base portion 221 includes a first sloped surface 251 and the floating portion 222 includes a second sloped surface 254 opposing and complementary to the first sloped surface 251. Accordingly, when the fasteners 225 are tightened, the first sloped surface 251 of the base portion 221 creates a wedge effect force, indicated by arrow F. A vertical component of the wedge effect force forces the top surface 255 of the floating portion 222 against the bottom surface 256 of the clamp portion 223. The ground plane at the exposed ground pad 239 of the flexible tip portion 230 is thus forced against the top surface 255 of the floating portion 222, which improves electrical grounding and enhances transfer of the analog RF signal through center pins 244, discussed above. A horizontal component of the wedge effect force drives a side surface 265 of the floating portion 222 against an opposing side surface 266 of the clamp portion 223, enhancing signal integrity by preventing formation of a gap.

In addition, the base portion 221 includes a first ridge 252 and a second ridge 253, both of which run along a width of the connector assembly 220. The first ridge 252 abuts a bottom surface 257 of the floating portion 222 to maximize clamping force created by fasteners 225 directly above the first ridge 252. The second ridge 253 abuts a bottom surface 258 of the clamp portion 223 to keep it substantially parallel to the top surface 259 of the base portion 221. The second ridge 253 in particular keeps the RF connectors 227 and 228 aligned and properly oriented relative to the amplifier socket 216 and the exposed RF connectors 337 and 338 of the cable assembly 120 as the fasteners 225 are operated to increase and decrease the clamping pressure. In addition, the base portion 221 includes a notch 260 and the clamp portion 223 includes a complementary inverse feature 261 insertable into the notch 260 to further secure the clamp portion 223 in proper position relative to the base portion 221.

Figure 6:
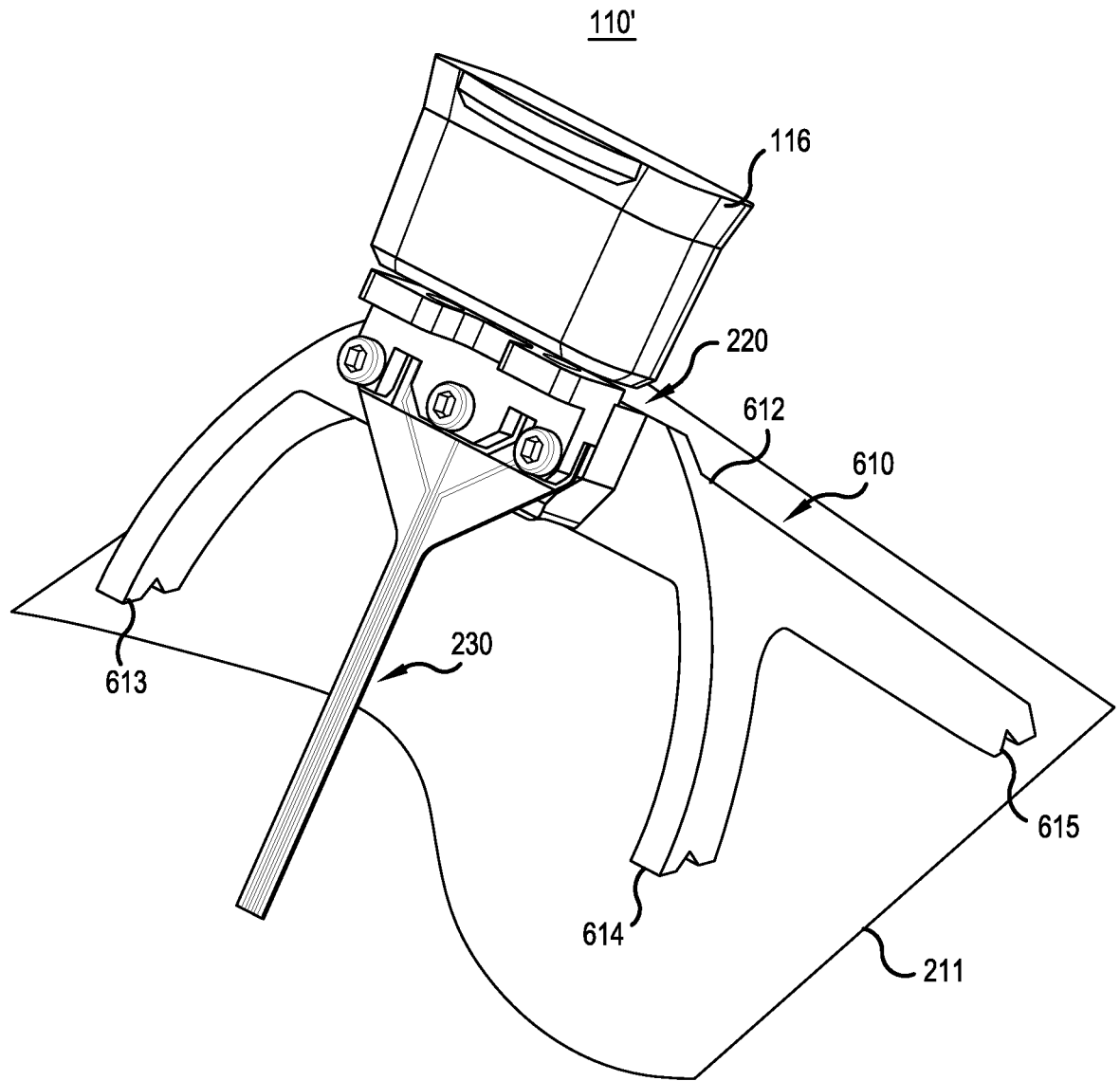
FIG. 6 is a perspective view of a probe tip of a probe for connecting a T&M instrument to a DUT, according to another representative embodiment.

FIG. 6 is a perspective view of a probe tip of a probe for connecting a T&M instrument to a DUT, according to another representative embodiment.

Referring to FIG. 6, probe tip 110' includes a rigid frame 610, connector assembly 220 attached to or integrated with the rigid frame 610, and flexible tip portion 230 removably attached to the connector assembly 220, as discussed above. The rigid frame 610 is configured to attach to stable base 211 for stability during testing and measurement operations. The stable base 211 may be a surface of the DUT 101 or may be a support structure configured to hold the DUT 101 during the testing and measurement operations. The connector assembly 220 and the flexible tip portion 230 are substantially the same as discussed with reference to FIGS. 2-5B, and therefore the descriptions will not be repeated.

In the depicted embodiment, the rigid frame 610 includes a rigid cradle 612 configured to attach to the surface of the DUT 101 or the support structure at multiple mounting supports, indicated by first mounting support 613, second mounting support 614, and third mounting support 615. The rigid cradle 612 may be attached using an adhesive, such as hot glue or adhesive putty, for example, at each of the first, second, and third mounting supports 613, 614, and 615. Alternatively, the rigid cradle 612 may be mechanically attached using a physical connector, such as screws, clips, or pins, or may be soldered directly to the stable base 211 (e.g., DUT 101), for example. The rigid frame 210 also includes an amplifier socket 216 attached to or integrated with a top portion of the rigid cradle 612.

The orientation of the connector assembly 220 and the flexible tip portion 230 in the probe tip 110' is different from the orientation of the connector assembly 220 and the flexible tip portion 230 in the probe tip 110 as shown in FIG. 2. In particular, the connector assembly 220 of the probe tip 110' is positioned such that the flexible tip portion 230 exits the connector assembly 220 substantially perpendicular to the surface of the stable base 211. In comparison, the connector assembly 220 of the probe tip 110 is positioned such that the flexible tip portion 230 exits the connector assembly 220 substantially parallel to the surface of the stable base 211.

Figure 7:
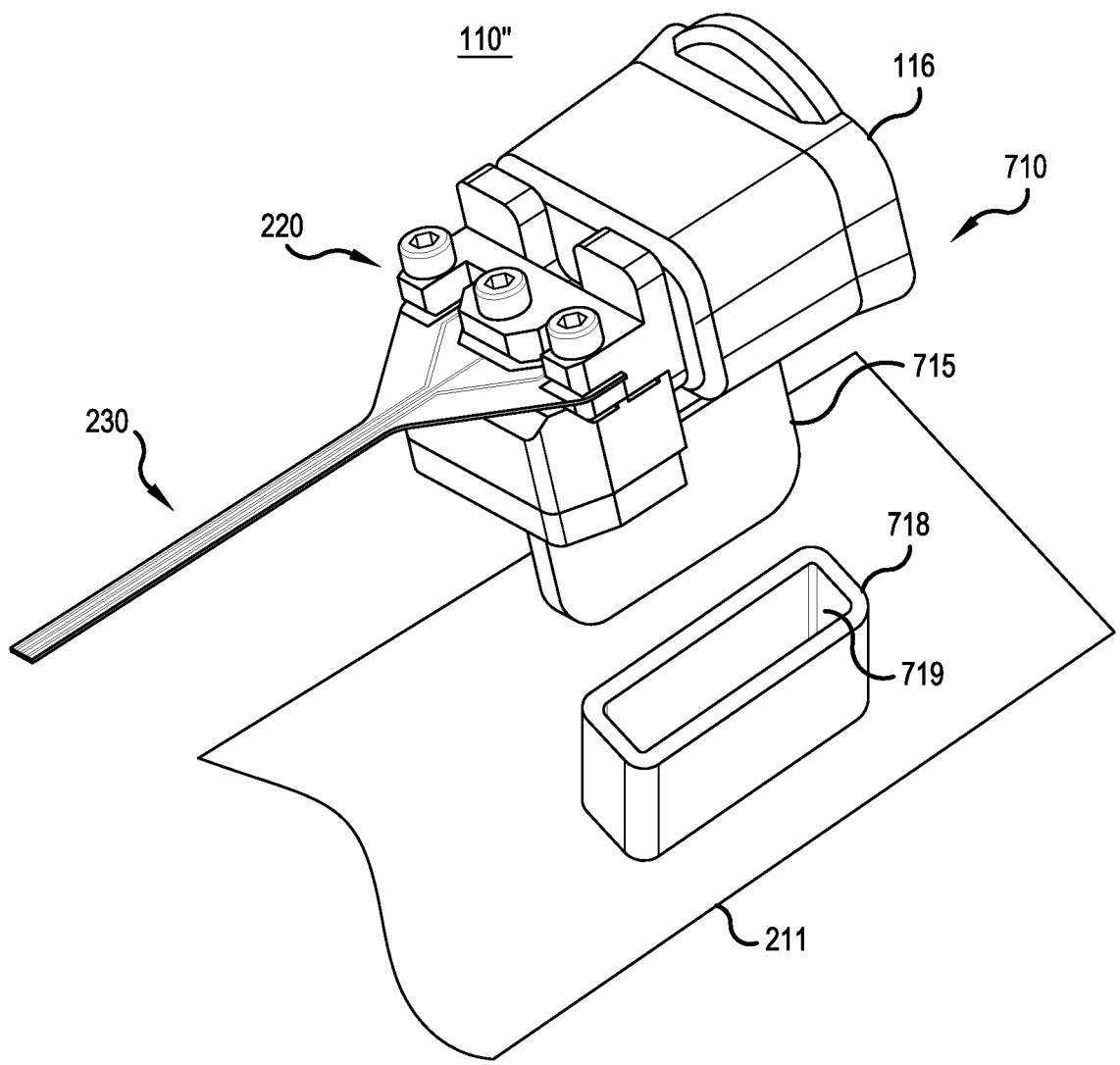
FIG. 7 is a perspective view of a probe tip of a probe for connecting a T&M instrument to a DUT, according to another representative embodiment.

FIG. 7 is a perspective view of a probe tip of a probe for connecting a T&M instrument to a DUT, according to another representative embodiment.

Referring to FIG. 7, probe tip 110" includes a rigid frame 710, connector assembly 220 attached to or integrated with the rigid frame 710, and flexible tip portion 230 removably attached to the connector assembly 220, as discussed above. The rigid frame 710 includes a tab 715 configured to attach to a tab insert 718 on stable base 211 for stability during testing and measurement operations. The stable base 211 may be a surface of the DUT 101 or may be a support structure configured to hold the DUT 101 during the testing and measurement operations. The connector assembly 220 and the flexible tip portion 230 are substantially the same as discussed with reference to FIGS. 2-5B, and therefore the descriptions will not be repeated.

The depicted configuration, the tab insert 718 includes a slot 719 into which the tab 715 is removably inserted. However, tab insert 718 may include other structures configured securely hold the tab 715 in position on the stable base 211, such as a clamp, without departing from the scope of the present teachings. When the tab 715 is secured by a clamp, the tab insert 718 would have spring loaded sides, for example, configured to apply opposing forces on opposite sides of the tab 715 to securely hold the tab 715 in position. The tab insert 718 may be integrated with or attached to the stable base 211. For example, the tab insert 718 may be attached to the stable base 211 using an adhesive, such as hot glue or adhesive putty, for example, or may be mechanically attached using a physical connector, such as screws, clips, or pins, for example.

The rigid frame 710 also includes an amplifier socket 216 attached to or integrated with a top portion of the rigid frame 710. The orientation of the connector assembly 220 and the flexible tip portion 230 in the probe tip 110" is substantially the same as the orientation of the connector assembly 220 and the flexible tip portion 230 in the probe tip 110 as shown in FIG. 2.

The illustrations of the embodiments described herein are intended to provide a general understanding of the structure of the various embodiments. The illustrations are not intended to serve as a complete description of all of the elements and features of the disclosure described herein. Many other embodiments may be apparent to those skilled in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A probe tip for connecting a test instrument to a device under test (DUT), the probe tip comprising:
a rigid frame configured to attach to a stable base, wherein the stable base is configured to provide stability during a testing and measuring operation;
a connector assembly attached to or integrated with the rigid frame; and
a flexible tip portion removably connected at a proximal end to the connector assembly, wherein the flexible tip portion comprises a plurality of DUT contacts at a distal end and a plurality of electrical leads respectively connected to the plurality of DUT contacts.

2. The probe tip of claim 1, wherein the flexible tip portion comprises a flex printed circuit assembly (PCA).

3. The probe tip of claim 1, wherein the flexible tip portion has a length less than about 6 cm.

4. The probe tip of claim 1, further comprising:
an amplifier socket configured to receive a probe amplifier connected to the test instrument via a probe cable.

5. The probe tip of claim 4, wherein the connector assembly comprises a plurality of signal connectors exposed within the amplifier socket, wherein the plurality of signal connectors are configured to connect the plurality of electrical leads of the flexible tip portion to the probe amplifier.

6. The probe tip of claim 5, wherein the plurality of signal connectors comprise sub-miniature push-on micro (SMPM) connectors.

7. The probe tip of claim 5, wherein the connector assembly further comprises:
a plurality of contact pins protruding from the connector assembly, wherein the plurality of contact pins are configured to contact the plurality of electrical leads of the flexible tip portion to provide an electrical connection between the plurality of electrical leads and the plurality of signal connectors exposed within the amplifier socket.

8. The probe tip of claim 1, wherein the stable base comprises the DUT, and wherein the rigid frame comprises a rigid cradle configured to attach to a surface of the DUT.

9. The probe tip of claim 8, wherein the DUT comprises a printed circuit assembly (PCA), wherein the PCA comprises the surface to which the rigid cradle is attached.

10. The probe tip of claim 8, wherein the rigid cradle attaches to the surface of the DUT using hot glue or adhesive putty.

11. The probe tip of claim 1, wherein the stable base comprises a support structure configured to hold the DUT during testing, and wherein the rigid frame comprises a tab insertable into a clamp or a slot on the support structure.

12. The probe tip of claim 1, wherein the connector assembly comprises:
a base portion integrated with or attached to the rigid frame;
a floating portion arranged on the base portion; and
a clamp portion arranged on the floating portion, wherein the flexible tip portion is mechanically clamped between the clamp portion and the floating portion.

13. The probe tip of claim 12, wherein the connector assembly further comprises:
a plurality of fasteners configured to apply pressure between the clamp portion and the floating portion to mechanically clamp the flexible tip portion between the clamp portion and the floating portion.

14. The probe tip of claim 13, wherein the flexible tip portion defines at the proximal end a plurality of slots aligned with the plurality of fasteners, respectively, enabling insertion and removal of the flexible tip portion between the clamp portion and the floating portion without removing the plurality of fasteners.

15. The probe tip of claim 1, wherein the flexible tip portion comprises a plurality of folds to enhance flexibility.

16. A probe tip for connecting a test instrument to a device under test (DUT), the probe tip comprising:
a rigid cradle comprising a plurality of mounting supports configured to attach to the DUT;
an amplifier socket attached to or integrated with the rigid cradle, wherein the amplifier socket is configured to receive a probe amplifier connected to the test instrument via a probe cable;
a connector assembly attached to or integrated with the rigid cradle, wherein the connector assembly comprises a plurality of radio frequency (RF) connectors aligned with a plurality of RF connectors of the probe amplifier positioned in the amplifier socket; and
a flexible tip portion removably connected at a proximal end to the connector assembly, wherein the flexible tip portion comprises a plurality of DUT contacts at a distal end for connecting to the DUT, a plurality of probe contacts at the proximal end for connecting to the plurality of RF connectors in the connector assembly, and a plurality of signal traces respectively connecting the plurality of DUT contacts and the plurality of probe contacts.

17. The probe tip of claim 16, wherein the connector assembly comprises a plurality of center pins configured to establish electrical connections between the plurality of probe contacts and the plurality of RF connectors of the connector assembly, respectively, wherein the plurality of center pins are arranged to provide narrow gaps into which the flexible tip portion is slidably positioned, such that the plurality of center pins contact the plurality of probe contacts.

18. The probe tip of claim 16, wherein the connector assembly comprises:
a base portion integrated with or attached to the rigid cradle, wherein the base portion includes a first sloped surface;
a floating portion arranged on the base portion, wherein the floating portion includes a second sloped surface opposing and complementary to the first sloped surface of the base portion; and
a clamp portion arranged on the floating portion, wherein the flexible tip portion is mechanically clamped between the clamp portion and the floating portion using a plurality of fasteners,
wherein the first and second sloped surfaces create a wedge effect force in response to the plurality of fasteners being tightened to mechanically clamp the flexible tip portion between the clamp portion and the floating portion, enhancing a clamping pressure on the flexible tip portion.

19. The probe tip of claim 18, wherein the flexible tip portion further comprises a plurality of exposed ground pads at the proximal end of the flexible tip portion connected to at least one ground trace, wherein the plurality of exposed ground pads are aligned with the plurality of fasteners, and wherein the wedge effect force further enhances electrical grounding at the plurality of exposed ground pads.

20. A probe tip for connecting a test instrument to a device under test (DUT), the probe tip comprising:
- a rigid frame including a tab insertable into a slot or a clamp attached to the DUT or to a support structure configured to hold the DUT;
- an amplifier socket attached to or integrated with the rigid frame, wherein the amplifier socket is configured to receive a probe amplifier connected to the test instrument via a probe cable;
- a connector assembly attached to or integrated with the rigid frame, wherein the connector assembly comprises a plurality of radio frequency (RF) connectors aligned with a plurality of RF connectors of the probe amplifier positioned in the amplifier socket; and
- a flexible tip portion removably connected at a proximal end to the connector assembly, wherein the flexible tip portion comprises a plurality of DUT contacts at a distal end for connecting to the DUT, a plurality of probe contacts at the proximal end for connecting to the plurality of RF connectors in the connector assembly, and a plurality of signal traces respectively connecting the plurality of DUT contacts and the plurality of probe contacts.

* * * * *